United States Patent [19]

Chu et al.

[11] 4,292,394
[45] Sep. 29, 1981

[54] PROCESS FOR PREPARING MULTICOLOR TONED IMAGES ON A SINGLE PHOTOSENSITIVE LAYER

[75] Inventors: Victor F. H. Chu, Wilmington, Del.; James Riesenfeld, Basking Ridge, N.J.

[73] Assignee: E. I. Du Pont de Nemours and Company, Wilmington, Del.

[21] Appl. No.: 108,839

[22] Filed: Dec. 31, 1979

Related U.S. Application Data

[63] Continuation-in-part of Ser. No. 959,627, Nov. 13, 1978, abandoned.

[51] Int. Cl.³ ............................................... G03C 5/00
[52] U.S. Cl. ..................................... 430/291; 430/293; 430/401; 430/432; 427/197; 427/201; 427/346; 427/355
[58] Field of Search ............... 430/291, 293, 120, 124, 430/142, 144, 401, 432; 427/197, 201, 346, 355

[56] References Cited

U.S. PATENT DOCUMENTS

| | | | |
|---|---|---|---|
| 2,659,672 | 11/1953 | Leuch | 96/2 |
| 3,487,764 | 1/1970 | Borden et al. | 430/291 X |
| 3,511,654 | 5/1970 | Kishida et al. | 430/291 X |
| 3,620,726 | 11/1971 | Chu et al. | 96/27 R |
| 3,637,385 | 1/1972 | Hayes et al. | 96/48 |
| 3,649,268 | 3/1972 | Chu et al. | 96/27 |
| 3,676,121 | 7/1972 | Jones et al. | 96/13 |
| 3,677,757 | 7/1972 | Nishizawa et al. | 430/291 X |
| 3,915,704 | 10/1975 | Limburg et al. | 430/270 |
| 3,917,483 | 11/1975 | Limburg et al. | 430/270 |
| 3,997,344 | 12/1976 | Schlesinger et al. | 430/291 |
| 4,087,279 | 5/1978 | Sandner | 430/120 |

FOREIGN PATENT DOCUMENTS 2758209 12/1977 Fed. Rep. of Germany .

*Primary Examiner*—Edward C. Kimlin

[57] ABSTRACT

Process for preparation of multicolor images on a single negative-working photosensitive layer which comprises imagewise exposing the layer through a transparency to form tacky image areas; toning the tacky image areas with a toner which becomes swollen or solubilized upon contact with the tacky areas; buffing or rubbing the toned image areas until glossy; and repeating the exposing, toning and buffing or rubbing using a different image-bearing transparency and appropriate toner. The process is useful in preparing multicolor proofs, e.g., maps, textile and wall covering design proofs and samples, etc.

17 Claims, 1 Drawing Figure

U.S. Patent  Sep. 29, 1981  4,292,394
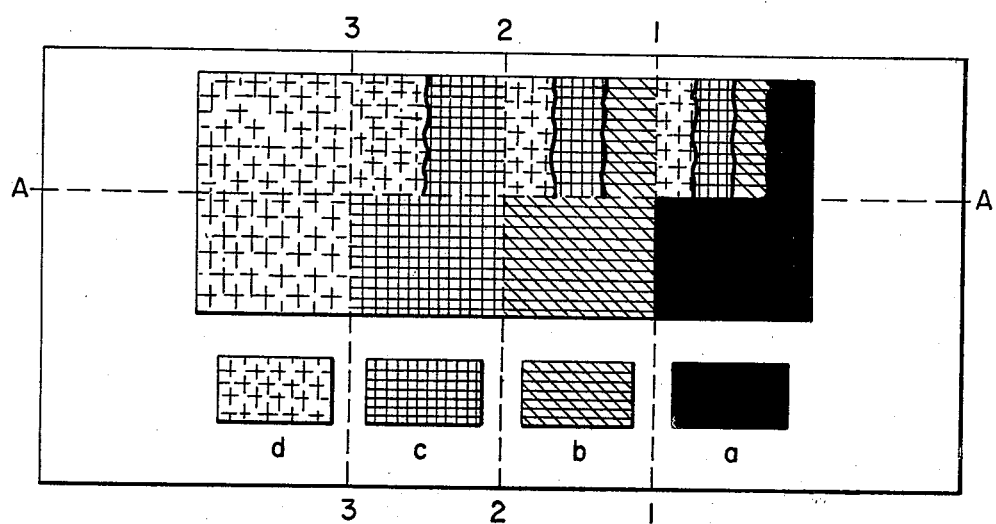

PROCESS FOR PREPARING MULTICOLOR TONED IMAGES ON A SINGLE PHOTOSENSITIVE LAYER

CROSS REFERENCE TO PRIOR APPLICATION

This is a continuation-in-part of Application Ser. No. 959,627, filed Nov. 13, 1978, now abandoned.

DESCRIPTION

1. Technical Field

This invention relates to a process for preparing multicolor toned images on a single layer and more particularly to a process wherein the layer is a negative-working tonable photosensitive layer.

2. Background Art

Image reproduction processes are known wherein photosensitive elements, such as photopolymerizable elements comprising a base support bearing a photopolymerizable layer comprising at least one addition polymerizable monomeric compound and a photopolymerization initiator, are exposed imagewise through an original transparency forming nontacky image areas in the exposed image areas. The image is made visible by dusting with a suitable toner which adheres only to the unexposed tacky areas and excess toner is removed from the exposed, nontacky image areas.

By the aforementioned process, positive colored images of the original are obtained which are equivalent of press proofs. It is also desirable, however, to form negative images with respect to the original. One system for preparing such negative images is described in German Application No. P 27 58 209.8 filed Dec. 27, 1977. While the latter system is useful in forming good negative images, it heretofore has been useful only for forming single color toned imges in a layer. Multicolor images can be obtained, but this requires the use of two or more layers applied consecutively by coating or laminating, each layer containing a single-color toned image. No process is presently known whereby good quality multicolor toned negative images can be achieved on a single photosensitive layer.

DISCLOSURE OF THE INVENTION

In accordance with this invention, there is provided a process for the preparation of a multicolor image using a negative-working tonable photosensitive layer which comprises:

(a) exposing said layer imagewise to actinic radiation through an image-bearing transparency, the exposed image areas of the layer becoming tacky;

(b) toning the tacky image areas by applying and adhering thereto a toner material which is swollen or solubilized when in contact with the tacky image areas; characterized by (c) buffing or rubbing the toned image areas whereby the areas become glossy; and (d) repeating steps (a), (b) and (c) at least once using a different image-bearing transparency for each exposure (a) and toning with a toner of appropriate color different from the color of the toner in step (b).

The process of the invention is useful with negative-working tonable photosensitive layers. The negative-working layers must be capable of retaining toner in the exposed image areas, generally at normal room temperature conditions. Preferred negative-working tonable photosensitive compositions are compositions which comprise at least one thermoplastic binder and a photosensitive system of at least one dihydropyridine compound of the formula

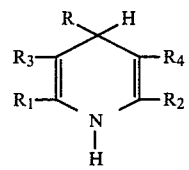

wherein

R is alkyl, alkylene, aryl and heteroaryl, $R_1$ and $R_2$, which can be the same or different, are alkyl, and $R_3$ and $R_4$, which can be the same or different, are COOR′, COR′, CN, R′ is alkyl, and at least one hexaarylbiimidazole compound. These compositions are disclosed in Abele and Grossa German Application No. P 27 58 209.8 filed Dec. 27, 1977.

Suitable dihydropyridine compounds, one component of the photosensitive system, are described in Table 1 of German Appliction No. P 27 58 209.8, including the following compounds:

2,4,6-trimethyl-3,5-bis(carbethoxy)-1,4-dihydropyridine;

2,6-dimethyl-4-ethyl-3,5-bis(carbethoxy)-1,4-dihydropyridine; 2,6-dimethyl-4-n-propyl-3,5-bis (carbethoxy)-1,4-dihydropyridine; 2,6-dimethyl-4-benzyl-3,5-bis(carbethoxy)-1,4-dihydropyridine; etc.

Suitable hexaarylbiimidazole compounds, the second component of the photosensitive system are described in U.S. Pat. No. 3,630,736, column 7, line 62 to column 10, line 64, including the following compounds:

2,2′,4,4′,5,5′-hexaphenylbiimidazole; 2,2′-bis(2-chlorophenyl)-4,4′,5,5′-tetraphenyl-biimidazole; 2,2′-bis(2-chlorophenyl)-4,4′,5,5′-tetrakis(3-methoxyphenyl)biimidazole; 2,2′-bis(2-methoxyphenyl)-4,4′,5,5-tetraphenylbiimidazole; etc.

Useful compatible thermoplastic binders in the negative-working compositions include: Acrylic acid and/or methacrylic acid ester polymers and/or their copolymers with other suitable monomers, e.g., acrylic or methacrylic acid or other acrylic or vinyl monomeric compounds; copolymers of maleic acid anhydride, or its di or half esters with styrene or other vinyl monomers; chlorine-containing vinyl polymers or copolymers, e.g., polyvinyl chloride including post chlorination products, polyvinylidene chloride, chlorinated polyethylene, etc.; polystrene and polystyrene copolymers; ethylene and ethylene copolymers, e.g., with maleic acid, etc.; synthetic types of rubber, e.g., butadiene, chloroprene and their copolymers, e.g., with styrene, acrylonitrile, etc.; polyethers, e.g., high molecular weight polyethylene oxide, polyepichlorohydrin, etc.

In addition to the preferred negative-working tonable photosensitive compositions containing at last one dihydropyridine compound described above, other useful negative-working tonable photosensitive compositions include: (1) a composition described in U.S. Pt. No. 3,915,704 comprising i. at least one acid degradable polymer of the formula

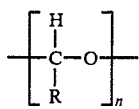

wherein

R is an aliphatic hydrocarbon radical of 1-6 carbon atoms, a chlorinated aliphatic hydrocarbon radical of 1-6 carbon atoms, or a nitrile substituted aliphatic hydrocarbon radical of 1-5 carbon atoms; and n is at least 50 ii. at least one acid generating polymer of the formula

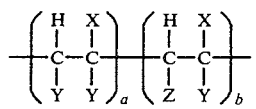

wherein

X is selected from among chlorine, bromine or iodine

Y and Y' are independently selected from X or hydrogen; and

Z is selected from among Y, alkyl of about 1 to 8 carbon atoms, phenyl or alkyl substituted phenyl, said alkyl substituent having from about 1 to 8 carbon atoms a and b represent the mole percent of each of the components within the acid generating polymer and have an aggregate value equal to 100% and iii. an organic electron acceptor; the weight ratio of acid degradable polymer to acid generating polymer ranging from about 99:1 to about 1:99 and the concentration of electronic acceptor ranging from about 0.1 to about 5 weight percent based upon the concentration of acid generating polymer, the acid degradable polymer is present in an amount of about 25 to about 40% by weight based on the weight of composition;

(2) a composition described in U.S. Pat. No. 3,917,483 comprising at least one acid degradable polymer of the formula:

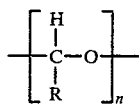

wherein

R is an aliphatic hydrocarbon radical of 1-6 carbon atoms, a chlorinated aliphatic hydrocarbon radical of 1-6 carbon atoms, or a nitrile substituted aliphatic hydrocarbon radical of 1-5 carbon atoms; and is at least 50; and a catalytically effective amount of at least one latent acid, a material generally regarded as nonacidic in the ground state but, which upon irradiation with ultraviolet light undergoes an electronic transition from the ground to the excited state whereupon a protein becomes disassociated from the latent acid and is released into the presence of the degradable polymer which is generally present in the composition in an amount of about 25 to about 40% by weight based on the weight of composition; and (3)

(a) at least one organic polymeric binder taken from the group consisting of polyvinylformal, polyvinylpyrollidone, polyacrylate, cellulose acetate, polymethacrylate, and polyvinyl acetate;

(b) a photosensitizer which upon absorption of actinic radiation is capable of generating an acid; and at least one acetal compound taken from the group of (c)

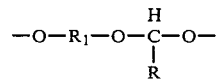

wherein R is hydrogen, alkyl of 1 to 18 carbon atoms, phenyl and substituted phenyl, and $R_1$ is taken from the group of alkylene of 2 to 12 carbon atoms and heteroalkylene of 2 to 12 carbon atoms, and (d)

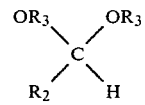

wherein $R_2$ is alkyl of 1 to 18 carbon atoms, furyl, substituted furyl, phenyl, substituted phenyl, naphthyl and substituted naphthyl, $R_3$ is alkyl of 1 to 18 carbon atoms, and $OR_3$ when taken together form a 5, 6, or 7 membered ring, the polymeric binder (a) being plasticized by the decomposition product of one compound (c), compound (d) or the combination of compounds (c) and (d).

Representative of acid degradable polymers for compositions (1) and (2) are poly(acetaldehyde), poly(propionaldehyde); poly(butylaldehyde) and mixtures or copolymers thereof and other compounds disclosed in U.S. Pat. No. 3,915,704. Acid generating polymers for composition (1) include: poly(vinylchloride), poly(vinylbromide), poly(vinyliodide), poly(vinylidene chloride), etc., as disclosed in U.S. Pat. No. 3,915,704. Also disclosed in this patent are representative organic acceptors present in trace amounts, e.g., tetracyanoethylene, bromanil, chloranil, cyananil, dicyanodichlorobenzoquinone, tetracyanoaquinodimethane and 2,4,7-trinitio-9-fluoroenone. Latent acids which are present in an amount of 0.1 to about 5.0 parts by weight per 100 parts by weight degradable polymer disclosed in U.S. Pat. No. 3,917,483 include: Hydroxyl functional naphthalene compounds such as beta-naphthol, phenols, and the halogen substituted napthols and phenols, e.g., p-chlorophenol.

Representative of negative-working tonable photoimaging compositions (3) are polyvinylformal, binder; 2-tribromomethylquinoxaline, photosensitizer; 2-phenyl-1,3-dioxane and/or polyacetal of formaldehyde and 1,5-pentanediol, acetals. In addition to the specific compositions (3) set forth above other useful polyacetals (c) are: benzaldehye and 1,5-pentanediol, butyraldehyde and 2,2'-oxydiethanol, butyraldehyde and triethylene glycol, furfural and 2-ethylhexane-1,6-diol, anisaldehyde and 1,5-pentanediol, benzaldehyde and 1,8-octanediol, octadecanal and 1,5-pentanediol, etc. Other useful acetals (d) are: 2-phenyl-1,3-dioxolane, α,α-dimethoxytoluene, 2-butyl-1,3-dioxolane, α,α-bis(2-butoxyethyloxy) toluene, 2-naphthyl-1,3-dioxolane, 1,1-dimethoxybutane 1,1-dibutoxyheptane, 2-(p-methoxyphenyl)-1,3-dioxane, 2-(dimethoxymethyl)-furan, 1,1-dibutoxyoctadecane, etc. Other useful photosensitizer compounds (b) are: carbon tetrabromide, N-chloro-2-azacyclononanone, 2-tribromomethylquinoline, 2,2,3,4-tetrachloronaphth-3-en-1-one, tris-trichloromethyl-S-triazine, tris-tribromomethyl-S-triazine.

Based on the total weight percent of total solids of the photoimaging composition (3) there are present
binder (a) 20 to 80%, photosensitizer (b) 3 to 25%, polyacetal (c) 20 to 60%, acetal (d) 20 to 60% with a combined weight of acetals (c) and (d) of 20 to 60%. Preferably the components are present in the composition as follows:
binder (a) 30 to 66%, photosensitizer (b) 5 to 15%, polyacetal (c) 25 to 35% (single component), 13 to 25% [in combination with acetal (d)] and acetal (d) 45 to 55% (single component, 20 to 30% [in combination with polyacetal (c)].

For photoimaging compositions (3) the above concentration ranges are governed by the degree of tackiness of the photoimaging layer and the compatibility of the components to form a clear layer. Tack-free nonexposed image areas are desirable to prevent undesired toning of background areas. The component percentages vary according to the particular combination present.

While not desiring to be limited to such an explanation, we believe it is necessary to the functioning of the invention that the toners, when applied to the exposed tacky image areas, become swollen or solubilized. This can be accomplished by having suitable plasticizers present in the system, e.g., in the photosensitive composition or formed therein. It is also possible, in the event that the photosensitive composition does not contain a plasticizer or a sufficient amount of the plasticizer, that the plasticizer can be present with the toner. Plasticizer materials present in the photosensitive composition include a monomeric compound, e.g., a diacrylate ester, or common plasticizer compatible with the binder material, e.g., dialkyl phthalates, polyoxyethylene (4) monolaurylether, olyethylene glycol, triethylene glycol diacetate, alkyl phosphates, etc.

The photosensitive layer can be present on a surface such as a polymer film, plastic, metal or sheet such as paper, wherein it strongly adheres. The photosensitive composition can be either laminated or coated on the surface under conditions known to those skilled in the art. Preferably the layer is laminated on paper such as Kromekote ® cast-coated one side cover paper manufactured by Champion Paper and Fiber Company or baryta-coated phototypesetting paper manufactured by Intermills Company. A known protective film, such as is described in U.S. Pat. No. 3,060,026, can be present on the photosensitive layer. The protective film, e.g., polyethylene terephthalate, polyethylene, etc., can be present during imagewise exposure but is removed prior to toning.

The photosensitive layers are exposed imagewise through image-bearing transparencies, e.g., line or halftone bearing color separation negative of the image to be reproduced. The image, e.g., block images, may be formed, if desired, by means of a mask of the desired shape and size. In order to prepare a multicolored toned image, it is necessary that at least one exposure occur for each color toner used.

Since most of the photosensitive compositions preferred in this invention generally exhibit their maximum sensitivity in the ultraviolet range, the radiation source should furnish an effective amount of this radiation. Such sources include carbon arcs, mercury-vapor arcs, fluorescent lamps with special ultraviolet-emitting phosphors, argon glow lamps, electronic flash units and photographic flood lamps. Several specific radiation sources are disclosed in the examples below. The amount of exposure required for satisfactory reproduction of a given photosensitive layer is a function of exposure time, type of radiation source used, and distance between the radiation source and layer surface. In general, exposure times range from 1 to 10 minutes or more using standard commercial radiation sources.

After the imagewise exposure the tacky exposed image areas are toned with an appopriate toner to reproduce the desired color. Toning is accomplished by dusting, applying toner particles in the form of a mound over the image surface, bringing the image surface in contact with a surface bearing loosely bound colorant, and other means known to those skilled in the art. As indicated above, generally the toner is applied at normal room temperature conditions. Slight heating of the photosensitive layer, e.g., at a temperature of up to about 70° C. is useful when increased toner density is required. The elevated temperature used should not materially affect the photosensitive layer. Suitable toners include solid organic resin dispersions of pigments as disclosed in U.S. Pat. No. 2,649,382 or of dyes as disclosed in U.S. Pat. No. 4,124,384. The resultant colorants have particle sizes within the range 0.2 to 30 microns, with less than 50% of the particles having 30 microns, with less than 50% of the particles having equivalent spherical diameters less than 1 micron. Preferably, more than 50% of the particles will have sizes in the range of 1 micron to 10 microns to limit background staining as disclosed in U.S. Pat. No. 3,620,726. Suitable organic resin matrices for these toners include: polyvinyl chloride; cellulose acetate; cellulose acetate butyrate; polystyrene; polymethylmethacrylate; etc. A particularly preferred resin is cellulose acetate, about 160 poises viscosity and about 39% by weight acetyl content. Suitable pigments include: Pigment Red 122 (C.I. not assigned), Pigment Red 123 (C.I. 71145), Black No. 88 (copper chromite), Dalamar ® Yellow (Pigment Yellow 74, C.I. 11741), Pigment Blue 15 (C.I. 74160), Pigment Green 7 (C.I. 74260), Pigment Yellow 101 (C.I. 48052), etc. Suitable dyes are classified in the Colour Index as "Disperse Dyes". Examples include: Latyl Blue BCN (C.I. Disperse Blue 56); Latyl ® Yellow 36 (C.I. Disperse Yellow 54, C.I. 47020); Latyl ® Cerise N (C.I. Disperse Red 60, C.I. 60756); C.I. Disperse Violet 28 (C.I. 61102); Sinclair and Valentine Brown dye 50-1301-06 and disperse blue dye C.I. 14 (C.I. 61500); Sinclair and Valentine Blue dye 50-0305-06 and disperse blue dye C.I. 14 (C.I. 61500); Magenta C.I. 17 (C.I. 11210); and Disperse Red 60 (C.I. 60756); etc.

After toning, any excess toner is removed by brushing, wiping or blowing techniques known to those skilled in the art. The toned tacky image areas are then buffed or rubbed until the areas become glossy. This is generally accomplished with a soft material so that the image surface is not damaged. A soft cloth such as cotton or a swab of cotton on a stick, etc. make effective buffing means. It is also possible to rub the toned image areas with resin powders such as ionic copolymer resins described in U.S. Pat. No. 3,264,272. Glossy image areas have been found to reject additional toner applied to the image areas. Occasionally, it may not be necessary to buff or rub the first tacky image on the photosensitive layer. This is due to the fact that the image consists of fine lines and lettering which covers less than about 3% of the tonable layer, e.g., a black record. The initial tones area, as well as the second toned image areas, are subsequently buffed or rubbed simultaneously prior to exposing the photosensitive layer through the third image transparency and buffing of the third toned image.

As indicated above, upon completion of the exposing, toning and buffing or rubbing steps (steps (a), (b) and (c)), these steps are repeated using a different image-bearing transparency whereby different areas of the photosensitive layer become tacky upon exposure, toned with a different color toner and are buffed or rubbed to seal the toned image areas. Each sequence as it is repeated, of course, uses a different image-bearing transparency and toner. As many colors as desired can be present on the same photosensitive layer. In order to protect the toned surface from damage during handling, a protective layer, e.g., a clear photopolymerizable layer of the type described in U.S. Pat. No. 3,649,248 can be applied, e.g., laminated, thereto. The protective layer is then hardened by exposing nonimagewise to actinic radiation from a source such as described above.

BEST MODE FOR CARRYING OUT THE INVENTION

The best mode is illustrated in Example 6 wherein the photosensitive layer contains a photosensitive system containing several dihydropyridine compounds and hexaarylbiimidazole compounds with a polymethylmethacrylate binder and polyoxyethylene (4) monolauryl ether and dioctyl phthalate as plasticizers. Preparation of a 5-color map is illustrated but other numbers of colors can be present.

INDUSTRIAL APPLICABILITY

The invention is useful for the low cost preparation of map proofs, colored engineering drawings, textile and wall covering design proofs. A large number of different colored images can be put on a single tonable layer resulting in a savings in material, labor and cost, compared with multilayer systems. With respect to the textile and other design proofs the final layer toned with sublimable dyes or pigments, with or without the photo-hardened protective layer can be brought into contact with a suitable receptor material such as fabric, e.g., polyethylene terephthalate; heating the toned surface to the receptor material, or both, for at least five seconds to a temperature at which the dyes or pigments sublime, and removing the toned layer from the receptor material. Thermal transfer of sublimable dyes in a photosensitive system is described in U.S. Pat. No. 4,124,384.

Color mixtures can be simulated by exposing the color separation negatives through a fine screen pattern, e.g., alternating opaque and clear lines. The pattern is moved between exposures to provide closely spaced tonable areas which when toned with the respective color for the particular negative used gives an appearance of a mixture of colors.

EXAMPLES

The following examples illustrate the invention wherein the percentages are by weight. Examples 1 and 2 describe positive-working compositions.

EXAMPLE 1

A photopolymerizable element of the type described in Example III-H of U.S. Pat. No. 3,854,950, minus the cover sheet, is laminated at 104° C. onto the smooth side of 12 point Kromekote® cast-coated one side cover paper manufactured by The Champion Paper and Fiber Company. The pressure rolls of the laminator are set to provide a wrinkle- and bubble-free laminate without stalling the laminator. The laminate is placed face-up in a vacuum frame, half the laminate is masked with opaque paper, and the vacuum frame is closed and pumped until Newton's rings appear between the glass cover and the surface of the protective cover and then the pumping is continued for an additional 45 seconds. The masked film is exposed for 2 units integrated exposure at 1 KW lamp input power to a nuArc N 1000 Instant Mercury Printer. After removal from the vacuum frame, the protective cover is removed and the surface is toned with a yellow toner of the type manufactured by the process of U.S. Pat. No. 2,649,382. Half of the toned image area is rubbed to make the areas shiny or glossy using an ionic copolymer resin powder of the type described in U.S. Pat. No. 3,264,272. The entire image is toned again with additional toner, either cyan or magenta in color, and is cleaned with a cotton pad. The additional toner adheres only in the areas not rubbed with the ionic copolymer powder.

The above procedure is repeated except that only the image areas toned yellow are buffed until glossy with a cotton swab on a stick. The cyan toner subsequently applied does not adhere to the buffed yellow image areas but adheres in the unbuffed areas.

EXAMPLE 2

This example describes the preparation of nonoverlapping multicolor images on a single tonable surface. All toners used in this example are of the type manufactured by the process of U.S. Pat. No. 2,649,382, but are given a surface treatment of Dow-Corning silicone DC 200/100 C.S. in proportions of 19.8 to 121.1 ml per kilogram of toner powder, during the manufacturing process.

A photopolymerizable element is laminated to Kromekote® paper as described in Example 1. After being placed in the vacuum frame, the laminate is shielded from exposing radiation by means of a larger rectangle and four small rectangles located near one long side of the large rectangle and is exposed as described in Example 1. As shown in the drawing, the large retangular area of the element is marked off vertically from top to bottom reading from left to right by lines designated, 3—3, 2—2 1—1 to divide the rectangle in four equal parts. The four areas are then divided in half by a horizontal line A—A which bisects the large rectangle. Immediately below the large rectangle are small rectangles (d), (c), (b), (a) located to the left of line 3—3, left of line 2—2, left of line 1—1 and right of line 1—1, respectively.

The area of the laminate to the left of line 1—1 is masked, the area to the right is toned with a black toner, and the excess toner is removed. The area above line A—A and the small rectangle (a) are masked, and the portion of the large rectangle below line A—A and to the right of line 1—1 is buffed until shiny with a soft cotton cloth. The mask above line A—A is removed, the mask on the laminate to the left of line 1—1 is moved to the left of line 2—2, and the entire areas to the right of line 2—2 is toned with a cyan (blue-green) toner. The area above line A—A and the small rectangle (b) are masked and the area below line A—A between lines 2—2 and 1—1 is buffed with the cotton cloth as described above. The mask above line A—A is again removed and the mask to the left of line 2—2 is moved to the left of line 3—3 the entire area to the right of line 3—3 is toned with a magenta (blue-red) toner and the excess toner is removed. The area above line A—A and the small rectangle (c) are masked and the area below line A—A and between lines 3—3 and 2—2 is buffed with the cotton cloth as described below. The mask above line A—A and to the left of line 3—3 is removed, and the entire laminate is toned with yellow toner and the excess toner is removed. Masks over small rectangles (a), (b) and (c) are then removed. A photopolymerizable element as described above is laminated to the toned surface and is exposed nonimagewise to harden the layer. The appearance of the toned laminate is as follows:

(a) The outer boundary area is substantially white with a small amount of stain, (b) Except for the yellow-toned region which was singly toned, the unbuffed, multitoned areas in the large rectangle above line A—A exhibit contaminated colors due to retention of toner from each toning, (c) The multitoned areas from below line A—A, the buffed areas of the large rectangle, exhibit single toned noncontaminated colors: magenta, cyan and black from left to right, (d) The singly-toned small rectangles exhibit no contamination: (d) is yellow, (c) is magenta, (b) is cyan and (a) is black.

EXAMPLE 3

A photosensitive composition is prepared by mixing the following ingredients:

| Component | Amount (g) |
| --- | --- |
| Polymethylmethacrylate, of very high M.W., inherent viscosity 0.92[1] | 42,857.00 |
| Polyoxyethylene (4) monolauryl ether | 15.00 ml |
| Triethylene glycol diacetate | 8.57 ml |
| Benzophenone | 6.50 |
| 2,2',4,4',5,5'-hexaphenyl-biimidazole | 28.10 |
| 2,2'-bis(2-chlorophenyl)-4,4',5,5'-tetraphenylbiimidazole | 31.38 |
| 2,2'-bis(2-methoxyphenyl)-4,4',5,5'-tetraphenylbiimidazole | 30.95 |
| 2,4,6-trimethyl-3,5-bis(carbethoxy)-1,4-dihydropyridine | 9.54 |
| 2,6-dimethyl-4-ethyl-3,5-bis(carbethoxy)-1,4-dihydropyridine | 10.04 |
| 2,6-dimethyl-4-propyl-3,5-bis(carbethoxy)-1,4-dihydropyridine | 10.54 |
| 2,6-dimethyl-4-propyl-3,5-bis(carbethoxy)-1,4-dihydropyridine | 12.24 |
| Hydroquinone[2] | 1.00 |
| Polyethylene oxide[2], MW ~ 4,000,000 1500–3500 cps/1% soln/25° C. | 1.00 |
| Methylene chloride | 2,100.00 |

[1] 0.25 g polymer in 50 ml chloroform at 20° C. using a No. 50 Cannon-Fenske Viscometer.
[2] Dissolved at 40° C. in 60 ml methanol The solution is coated on 0.75 mil (0.019 mm) polypropylene film and is dried to give a dry coating weight of 30 mg/dm². A cover sheet of silicone-treated 1.0 mil (0.25 mm) thick polyethylene terephthalate film is laminated thereon. This element, after removal of the cover sheet, is laminated to Kromekote paper as described in Example 1 except that the lamination temperature is about 99° C. The laminate is given a 10-unit integrated exposure employing the exposure device described in Example 1 using an opaque template comprising a four-inch (10.16 cm) square with a two-inch (5.08 cm) square removed from one corner to provide a symmetrical L shape.

The toners used in this example are described in U.S. Pat. No. 3,909,282. The exposed two-inch (5.08 cm) square is toned with a high strength yellow toner and is buffed with a cotton cloth as described in Example 2 until all toned image areas are shiny except for a small triangular area near the center which is unbuffed.

The template is rotated 90°, a second exposure is made as described previously above, the tacky area is toned with high strength magenta toner, and the toned area is buffed leaving an unbuffed area as previously described. The same procedure is repeated two more times using cyan and black toners, respectively. The image areas toned black are not buffed since this is the last toner applied. The toned film exhibits relatively pure color in each of the four squares except that in the unbuffed area of each color contamination is observed due to some toner retention.

The above procedure is repeated except that the order of toner application is reversed, i.e., black, cyan, magenta and yellow. Identical results are achieved.

EXAMPLE 4

The photosensitive element prepared as described in Example 3, after removal of the cover sheet, is laminated to Intermills ® baryta-coated phototypesetting paper as by the procedure described in Example 3. The laminate is exposed through a black record separation negative using a nuArc FT40LC FLip Top Platemaker operating a 4 KW power input to the pulsed xenon source, and employing two 120-unit integrated exposures as registrated by a Luxometer Model H exposure integrator, or about 50 seconds at high intensity. The image areas are toned with black toner described in Example 3, and the excess toner is removed. No buffing is used on the black image which consists of fine lines and lettering covering a minimal area (less than 3 percent of the total area) of the element. The exposure, toning and removal of excess toner are repeated three times, each time using a different color separation negative and appropriate toner prepared as described in U.S. Pat. No. 3,909,282. Each toned image area is buffed as described in Example 2 after the application of each toner. The separation negatives (in sequence of increasing area covered with appropriate toner) are: magenta, cyan and green. A 4-color map is achieved. The procedure of this example is repeated using a 60 second exposure of about 268 units integrated exposure for each record separation negative. A good 4-color map is thus achieved.

EXAMPLE 5

The laminate described in Example 4 is exposed through a black separation negative of a map for 50 units on the integrator (about 2.5 minutes) of a Berkey Ascor ® Vacuum Printer radiation source. The exposed image areas are toned with the black toner described in Example 3, excess toner is removed and the toned areas buffed with a clean-up cloth, LAS-STICK ® manufactured by LAS-STIK Manufacturing Co., of Hamilton, Ohio. The same exposure procedure, excess toner removal and buffing is repeated four additional times using brown, magenta, blue and green separation negatives of the map in this order. A photopolymerizable element as described in Example 1 is laminated over the 5-color map image, and the layer is hardened by exposing for 42 units with the radiation source described in Example 1. The support of the element is removed leaving a good quality image of the original map protected by a clear completely photohardened layer.

EXAMPLE 6

A photosensitive composition is prepared by mixing the following ingredients:

| Component | Amount (g) |
| --- | --- |
| Polymethylmethacrylate described in Example 4 | 60.00 |
| Polyoxyethylene (4) monolauryl ether described in Example 3 | 20.00 ml |
| Dioctyl phthalate | 6.00 ml |
| 2,2'-bis(2-chlorophenyl)4,4',5,5'-tetraphenylbiimidazole | 25.02 |
| 2,2'-bis(2-methoxyphenyl)4,4',5,5'-tetraphenylbiimidazole | 24.78 |
| 2,2'-bis(2-chlorophenyl)-4,4',5,5'-tetrakis(methoxyphenyl)biimidazole | 29.64 |
| 2,4,6-trimethyl-3,5-bis(carbethoxy)-1,4-dihydropyridine | 7.62 |
| 2,6-dimethyl-4-ethyl-3,5-bis-(carbethoxy)-1,4-dihydropyridine | 8.02 |
| 2,6-dimethyl-4-propyl-3,5-bis-(carbethoxy)-1,4-dihydropyridine | 8.42 |
| 2,6-dimethyl-4-benzyl-3,5-bis-(carbethoxy)-1,4-dihydropyridine | 9.78 |
| Bis-(2-hydroxy-3-butyl-5-ethyl-phenyl)methane, | 4.00 |
| Polyethylene oxide as described in Example 3 | 0.80 |
| Methylene chloride | 2,800.00 |

The solution is coated on 0.75 mil (0.019 mm) polypropylene film and the coating is dried to give a dry coating weight of 35 mg/dm$^2$. A cover sheet is laminated thereon as described in Example 3. The element formed is exposed imagewise and after removal of the cover sheet is toned, the excess toner is removed, and the image areas are buffed as described in Example 4. A 5-color map is achieved by using the following separation negatives and appropriate toners in order of increasing area covered, i.e., red, blue, black, brown and magenta. Similar good results are achieved by using the following separation negatives and appropriate toners, i.e., magenta, red, cyan, black and green. The toners are all of the type used in Examples 3 and 4.

EXAMPLE 7

This example describes the use of single layer, multi-toned elements in a thermal transfer process onto textile fabrics.

A photosensitive element as described in Example 3 is used to make a 2-color proof by exposing through each of two separation negatives and toning the respective image areas with cyan Latyl ® Blue BCN (C.I. Disperse Blue 56) and magenta Latyl ® Cerise N (C.I. Disperse Red 60) dyes dispersed in a cellulose acetate matrix 0.2 to 30μ equivalent particle diameter.

The first toned image is buffed as described in Example 2 prior to the second exposure and application of toner. The 2-color image is transferred to a 100% Dacron polyethylene terephthalate double knit fabric prepared from fibers manufactured by E. I. du Pont de Nemours and Company. A 16 inch (40.64 cm) flatbed press made by Precision Screen Machines, Hawthorne, N.J. is used for transfer. The press conditions are: one minute at 1000 psi (7030 kg/m$^2$) and 400° F. (204° C.). A good quality cyan and magenta image on the fabric is achieved.

The procedure of this example is repeated except that a good quality 3-color image from a single layer is prepared and transferred to the fabric. The 3-color transfer is prepared by exposing the layer in order through cyan, magenta and violet separation negatives. The violet toner used is C.I. Disperse Violet 28 (C.I. 61102) dye dispersed in a cellulose acetate matrix 0.2 to 30μ equivalent particle diameter. The press is heated to 410° C. (210° C.), other conditions remaining the same.

The procedure of this example is again repeated except that a good quality 4-color image from a single layer is prepared and transferred to the fabric. The 4-color transfer is prepared by exposing the layer in order through cyan, magenta, violet and yellow separation negatives. The yellow toner used is separation negatives. The yellow toner used is Latyl ® Yellow 3G (C.I. Disperse Yellow 54) dye dispersed in a cellulose acetate matrix 0.2 to 30μ equivalent particle diameter. The press is heated to 390° F. (199° C.), other conditions remaining the same.

EXAMPLE 8

The following negative-working tonable photoimaging composition is prepared by mixing the following components with stirring until the mixture is homogeneous:

| Component | Amount (g) |
| --- | --- |
| Polyvinyl formal[1] | 400.0 |
| 2-Phenyl-1,3-dioxane | 222.0 |
| Polyacetal of formaldehyde and 1,5-pentanediol | 184.0 |
| 2,2,3,4-Tetrachloro-3-napthen-1-one | 80.0 |
| Triethylene glycol diacetate, 1% solution in methylene chloride | 2.4 ml |

[1]Prepared from 95% hydrolyzed polyvinyl acetate, Formvar ® 7/95E Monsanto

The mixture is coated on a 0.001 inch (0.025 mm) thick polyethylene terephthalate film base using a 0.003 inch (0.076 mm) doctor knife. After drying, a portion of the coating is exposed for ten minutes through a separation transparency to a bank of black light blue fluorescent bulbs. It is then warmed on a hot plate and is dusted with a Du Pont 4C Cromalin ® red toner to produce a red image opposite to that of the transparency image (negative-working). A portion of the toned coating is then buffed with a soft cotton cloth. The toned, buffed coating is exposed again through a different separation transparency of the same image, warmed on the hot-plate and is dusted with a green Du Pont Cromalin ® toner. Two distinct green and red images are produced where the coating is buffed and exposed, with no mixed toning of the image areas. The red toned areas which remain unbuffed contain both red and green toner in the same image areas.

We claim:

1. Process for the preparation of a multicolor image using a negative-working tonable photosensitive layer which comprises:

(a) exposing said layer imagewise to actinic radiation through an image-bearing transparency, the exposed image areas of the layer becoming tacky;

(b) toning the tacky image areas by applying and adhering thereto a toner material which is swollen or solubilized when in contact with the tacky image areas, and removing any excess toner;

(c) buffing or rubbing the toned image areas whereby the areas become glossy;

(d) repeating steps (a), (b) and (c) at least once using a different image-bearing transparency for each exposure (a) and toning with a toner of appropriate color difference from the color of the toner of step (b).

2. A process according to claim 1 wherein there is applied completely over the multitoned layer a photohardenable layer which is nonimagewise exposed to actinic radiation to form a protective layer.

3. A process according to claim 1 wherein prior to step (a) the tonable photosensitive layer is laminated to a surface.

4. A process according to claim 3 wherein the surface is paper.

5. A process according to claim 1 wherein prior to step (a) the photosensitive layer is coated onto a surface and dried.

6. A process according to claim 5 wherein the surface is paper.

7. A process according to claim 1 wherein the image-bearing transparencies are color separation negatives.

8. A process according to claim 1 wherein the toned tacky image areas are made glossy by buffing with a soft material.

9. A process according to claim 8 wherein the buffing is accomplished with a soft cotton cloth.

10. A process according to claim 1 wherein the toned tacky image areas are made glossy by rubbing with an ionic copolymer resin.

11. A process according to claim 1 wherein the photosensitive layer comprises at least one thermoplastic binder and a photosensitive system which consists essentially of at least one dihydropyridine compound of the formula:

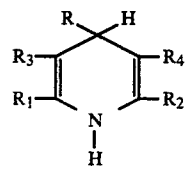

wherein
R is alkyl, alkylene, aryl and heteroaryl,
$R_1$ and $R_2$, which can be the same or different, are alkyl, and
$R_3$ and $R_4$, which can be the same or different, are COOR', COR', CN, R' is alkyl.

12. A process according to claim 1 wherein the initial toned image areas consist of fine lines and lettering covering less than about 3% of the tonable layer said image areas not being buffed or rubbed prior to repeating steps (a) and (b).

13. A process according to claim 1 wherein step (b) is accomplished at a temperature up to about 70° C.

14. A process according to claim 1 wherein the photosensitive layer contains an organic plasticizer compound which swells or solubilizes the toner when the toner is brought in contact with the tacky image areas.

15. A process according to claim 1 wherein the multicolor image is transferred to an image receptor at elevated temperature.

16. A process according to claim 15 wherein the image receptor is fabric.

17. A process according to claim 16 wherein the fabric is polyethylene terephthalate.

* * * * *